United States Patent [19]

Willis

[11] Patent Number: 4,617,722

[45] Date of Patent: Oct. 21, 1986

[54] METHOD FOR ELECTRICALLY INTERCONNECTING SOLAR CELLS

[75] Inventor: John G. Willis, Chelmsford, Mass.

[73] Assignee: Mobil Solar Energy Corporation, Waltham, Mass.

[21] Appl. No.: 677,877

[22] Filed: Dec. 4, 1984

[51] Int. Cl.⁴ .................. H01L 31/18; H01L 25/02
[52] U.S. Cl. ............................... 29/572; 29/589; 29/730; 136/244
[58] Field of Search .............. 29/572, 589, 591, 854, 29/730; 136/244; 228/180 R, 180 A, 58, 6.2, 179

[56] References Cited

U.S. PATENT DOCUMENTS 3,819,417 6/1974 Haynos ........................ 136/244
4,534,502 8/1985 Piurek ......................... 228/102

Primary Examiner—Aaron Weisstuch
Attorney, Agent, or Firm—Schiller & Pandiscio

[57] ABSTRACT

A method for electrically interconnecting a plurality of solar cells in series using a multi-faced drum, a first bus spool having an associated first bus strip, and a second bus spool having an associated second bus strip, wherein the method involves placing a solar cell on the then-current top face of the drum so that its top electrode underlies the first bus strip and its bottom electrode overlies the second bus strip, indexing the drum forward one face as the first bus spool is lowered and the second bus spool is raised, placing a new solar cell on the then-current top face of the drum so that its top electrode underlies the second bus strip and its bottom electrode overlies the first bus strip, indexing the drum forward another face as the first bus spool is raised and the second bus spool is lowered, and continuing the foregoing process as desired to interweave the first and second bus strips between additional solar cells. After the first and second bus strips are attached to the electrodes of the several solar cells, they are alternately severed between adjacent solar cells so as to complete the electrical interconnection of the cells in series.

16 Claims, 11 Drawing Figures

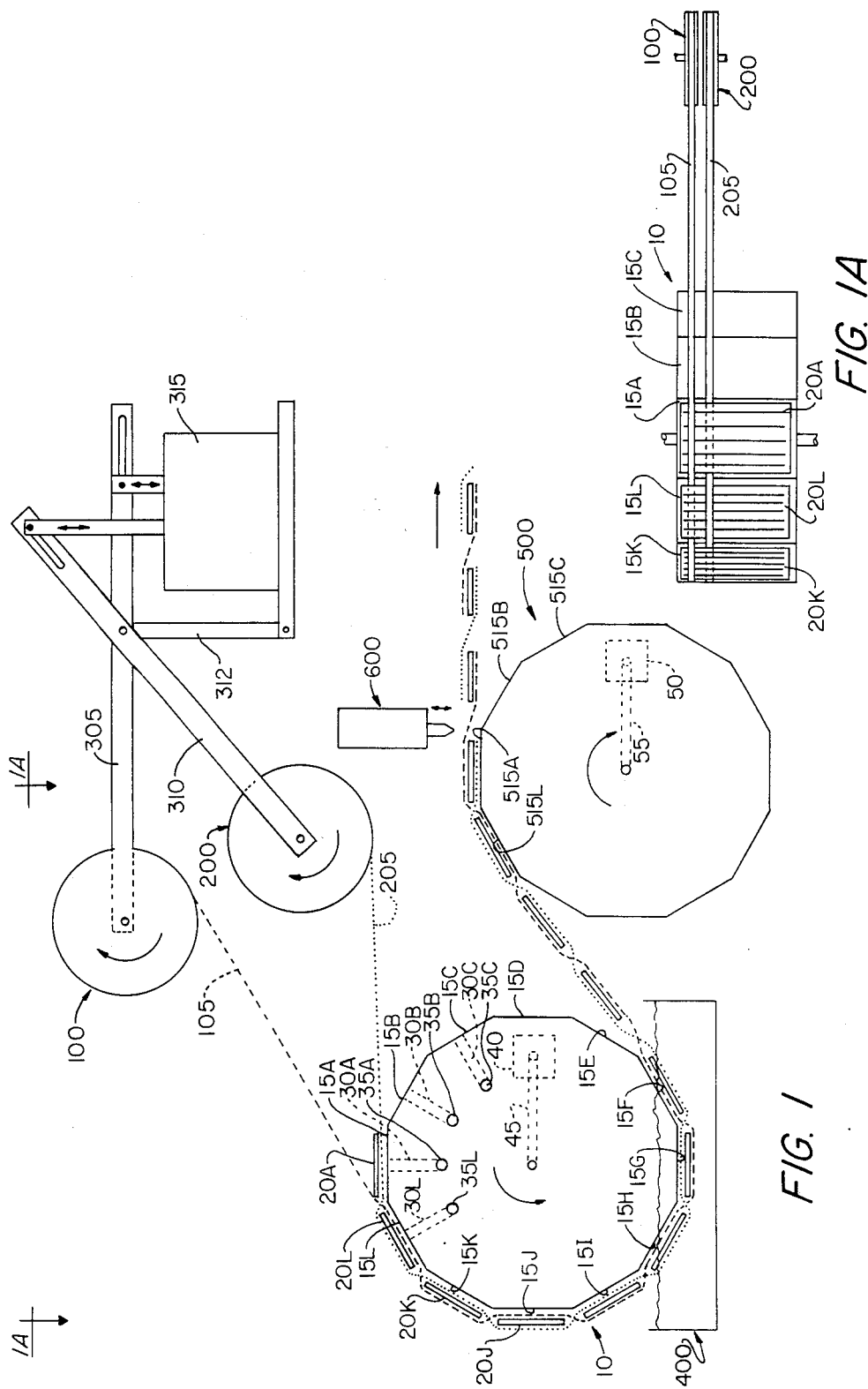

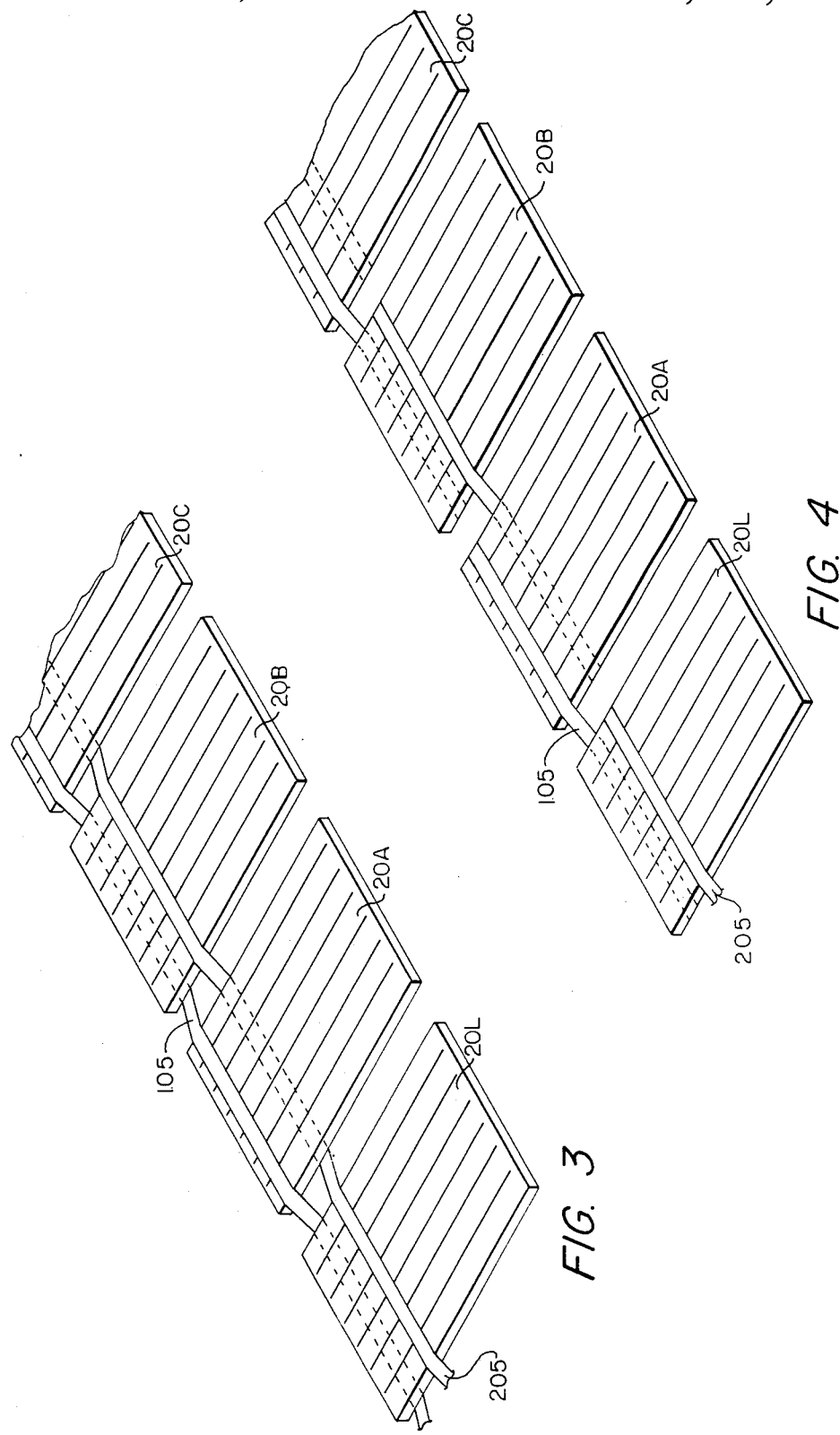

METHOD FOR ELECTRICALLY INTERCONNECTING SOLAR CELLS

FIELD OF THE INVENTION

This invention relates to photovoltaic solar cells in general, and more particularly to methods for electrically interconnecting photovoltaic solar cells.

BACKGROUND OF THE INVENTION

Photovoltaic solar cells are well known in the art. Such cells typically comprise a P-N or N-P semiconductor junction, and metal electrodes formed on the cell's top and bottom surfaces. The electrodes on the top (or front) sides of the solar cells are typically formed as a group of fingers connected by one or more buses, while the electrodes on the bottom (or back) sides of the solar cells are typically formed as uninterrupted layers (see, for example, U.S. Pat. Nos. 4,434,318 and 4,443,652).

As is well known in the art, when radiation of an appropriate wavelength strikes the top (or front) side of the solar cell, the radiation will generate electron-hole pairs in the cell and thereby produce a potential difference at the semiconductor junction and thus across the electrodes. The electron-hole pairs, in effect, move across the junction in opposite directions so as to provide an electric current which is capable of driving an external circuit.

By appropriately interconnecting the electrodes of two or more solar cells, an array of cells can be provided which will meet certain power requirements. For example, when the electrodes of two or more solar cells are connected in parallel (i.e., where the top electrode of a first cell is connected to the top electrode of an adjacent second cell, and the bottom electrode of the first cell is connected to the bottom electrode of the adjacent second cell), the current provided by the entire array will be the sum of the currents provided by each of the individual cells. Similarly, when the electrodes of two or more solar cells are connected in series (i.e., where the top electrode of a first cell is connected to the bottom electrode of an adjacent second cell, and the bottom electrode of the first cell is connected to the top electrode of an adjacent third cell, or to a load), the voltage provided by the entire array will be the sum of the voltages provided by each of the individual cells.

For convenience of description, the term "parallel array" will sometimes hereinafter be used to refer to an array of solar cells of the type wherein the cells are connected in parallel, and the term "series array" will sometimes hereinafter be used to refer to an array of solar cells of the type wherein the cells are connected in series.

In practice, it has proven to be a relatively simple matter to electrically interconnect a plurality of solar cells in parallel so as to produce a parallel array of cells. More specifically, the desired electrical interconnections may be effected quickly and easily through the use of a number of different interconnection methods. For example, one such method involves first positioning a continuous strip of bottom bus material on a work surface, then positioning a plurality of solar cells atop the bottom bus strip so that each solar cell's bottom electrode contacts the bottom bus strip, next positioning a continuous strip of top bus material atop the solar cells so that the top bus strip contacts each solar cell's top electrode, and finally securing the top and bottom bus strips to the top and bottom cell electrodes respectively by soldering or similar means. The foregoing method for electrically interconnecting a plurality of solar cells in parallel is fast and simple and lends itself well to automated assembly techniques.

A number of other methods are known for electrically interconnecting a plurality of solar cells in parallel so as to produce a parallel array of cells. In general, these methods also tend to be fast and simple and to lend themselves well to automated assembly techniques.

Unfortunately, it has proven to be a significantly more complex matter to electrically interconnect a plurality of solar cells in series so as to produce a series array of cells. This is because in a series array, the top electrode of a first cell must be connected not to the top electrode of an adjacent second cell, but rather to the bottom electrode of the adjacent second cell, while the bottom electrode of that first cell must be connected not to the bottom electrode of the adjacent second cell, but rather to the top electrode of an adjacent third cell, or to a load. As a result, the simple and straightforward interconnection methods available to produce a parallel array of solar cells are not applicable to produce a series array of solar cells.

Nevertheless, a number of different methods have been used to electrically interconnect a plurality of solar cells in series so as to produce a series array of cells. One such method involves the use of a plurality of short, separate bus strips to electrically interconnect the cells in the array, wherein each bus strip runs between the top electrode of one cell and the bottom electrode of an adjacent cell. The array is assembled by positioning a first solar cell on a work surface, then positioning a first bus strip on the work surface so that a portion of the first bus strip overlies and contacts the first cell's top electrode, then positioning a second cell on the work surface so that the second cell's bottom electrode overlies and contacts the free end of the first bus strip, then positioning a second bus strip on the work surface so that a portion of the second bus strip overlies and contacts the second cell's top electrode, then positioning a third cell on the work surface so that the third cell's bottom electrode overlies and contacts the free end of the second bus strip, etc. At some point in the process, all of the bus strips are securely attached to the cells' electrodes by soldering or similar means. See, for example, U.S. Pat. No. 4,430,519 (Young).

Another known method for electrically interconnecting solar cells in series also involves the use of a plurality of short, separate bus strips, wherein each bus strip runs between the top electrode of one cell and the bottom electrode of an adjacent cell. According to this method, however, the bus strips are all first securely mounted to a substrate. Then the cells are laid down so that each cell has its bottom electrode overlying and contacting one end of a bus strip. Thereafter, the other ends of the bus strips are made to overlie and contact the top electrodes of adjacent cells. Finally, the solar cells are securely attached to the bus strips by soldering or similar means. See, for example, U.S. Pat. No. 4,019,924 (Kurth).

Unfortunately, neither of the foregoing methods for electrically interconnecting a plurality of solar cells in series is relatively fast and simple, nor does either method lend itself well to automated assembly techniques.

Other methods used for electrically interconnecting a plurality of solar cells in series so as to produce a series array of cells are believed to be relatively slow and complex and not suitable for an automated assembly line.

OBJECTS OF THE INVENTION

Accordingly, the principal object of the present invention is to provide a novel method for electrically interconnecting a plurality of solar cells in series so as to produce a series array of cells.

Another object of the present invention is to provide a novel method for electrically interconnecting a plurality of solar cells in series which is fast and simple and which lends itself well to automated assembly techniques.

A further object of the present invention is to provide novel apparatus for use in carrying out the method of the present invention.

SUMMARY Of THE INVENTION

These and other objects are achieved by the present invention which comprises a novel method for electrically interconnecting a plurality of solar cells in series so as to form a solar cell array.

The novel method involves the use of a rotatable multi-faced drum and first and second movable bus spools. The drum is adapted so that (a) each of its faces is capable of receiving and releasably grasping a solar cell, and (b) it is capable of being rotatably indexed one face at a time, with the indexing being conducted so that at the conclusion of each indexing step, one drum face is always disposed in a predetermined "loading" position, and an adjacent drum face is always disposed in a predetermined "post-loading" position. The first and second bus spools comprise first and second continuous bus strips, respectively, and each of the two bus spools is adapted to be moved between a first position wherein its associated bus strip may be extended so as to be flush with the drum face which then occupies the drum's post-loading position and at an angle to the drum face which then occupies the drum's loading position, and a second position wherein its associated bus strip may be extended so as to be flush with the drum face which then occupies the drum's loading position and at an angle to the drum face which then occupies the drum's post-loading position.

The novel method for electrically interconnecting a plurality of solar cells in series comprises the steps of:

(1) positioning the first bus spool in its first position and extending its associated bus strip around the drum so that the first bus strip extends flush with the drum face which currently occupies the drum's post-loading position, and positioning the second bus spool in its second position and extending its associated bus strip around the drum so that the second bus strip extends flush with the drum face which currently occupies the drum's loading position;

(2) positioning a solar cell on the drum face which currently occupies the drum's loading position so that the cell sits atop the second bus strip, with the cell's bottom electrode overlying and contacting the second bus strip;

(3) indexing the drum forward one face so that the drum face bearing the solar cell is advanced to the drum's post-loading position, whereby the first and second bus strips will be advanced and the first bus strip will be brought across the top of the cell so as to overlie and contact the cell's top electrode while the second bus strip remains in contact with the cell's bottom electrode;

(4) transferring the first bus spool from its first position to its second position, and transferring the second bus spool from its second position to its first position, so that the second bus strip extends flush to the drum face which currently occupies the drum's post-loading position, and the first bus strip extends flush with the drum face which currently occupies the drum's loading position;

(5) positioning a new solar cell on the drum face which currently occupies the drum's loading position so that the cell sits atop the first bus strip, with the new cell's bottom electrode overlying and contacting the first bus strip;

(6) indexing the drum forward one face so that the drum face bearing the new solar cell is advanced to the drum's post-loading position, whereby the first and second bus strips will be advanced and the second bus strip will be brought across the top of the cell so as to overlie and contact the new cell's top electrode while the first bus strip remains in contact with the new cell's bottom electrode;

(7) transferring the first bus spool from its second position back to its first position, and transferring the second bus spool from its first position back to its second position, so that the first bus strip extends flush with the drum face which currently occupies the drum's post-loading position, and the second bus strip extends flush with the drum face which currently occupies the drum's loading position; and (8) thereafter repeating the foregoing Steps 2–7 as needed so as to interweave additional solar cells with the first and second bus strips.

In conjunction with the foregoing, the first and second bus strips are securely attached to the electrodes of the several solar cells by soldering or similar means. The attachment of the bus strips to the electrodes may be accomplished either while the solar cells reside on the drum or after they leave it. Additionally, after the first and second bus strips are attached to the cells, they are alternately severed between adjacent cells, again either while the solar cells reside on the drum or after they leave it, so as to complete the electrical interconnection of the cells and thereby form an effective series array of solar cells.

BRIEF DESCRIPTION OF THE DRAWINGS

Still other objects and features of the present invention will be more fully disclosed or rendered obvious in the following detailed description of the invention, which is to be considered together with the accompanying drawings wherein like numbers refer to like parts and further wherein:

FIG. 1 illustrates various means which may be used in practicing the present method for electrically interconnecting a plurality of solar cells in series so as to form a solar cell array;

FIG. 1A is a plan view taken along line 1A—1A of FIG. 1;

FIGS. 3 and 4 are isometric views of a plurality of solar cells which have been electrically interconnected in accordance with the present method so as to form a series array of solar cells (FIG. 3 shows the array prior to alternately severing the first and second bus strips between adjacent solar cells, and FIG. 4 shows the array after alternately severing the first and second bus strips between adjacent solar cells).

DETAILED DESCRIPTION OF THE INVENTION

Figure 2A:
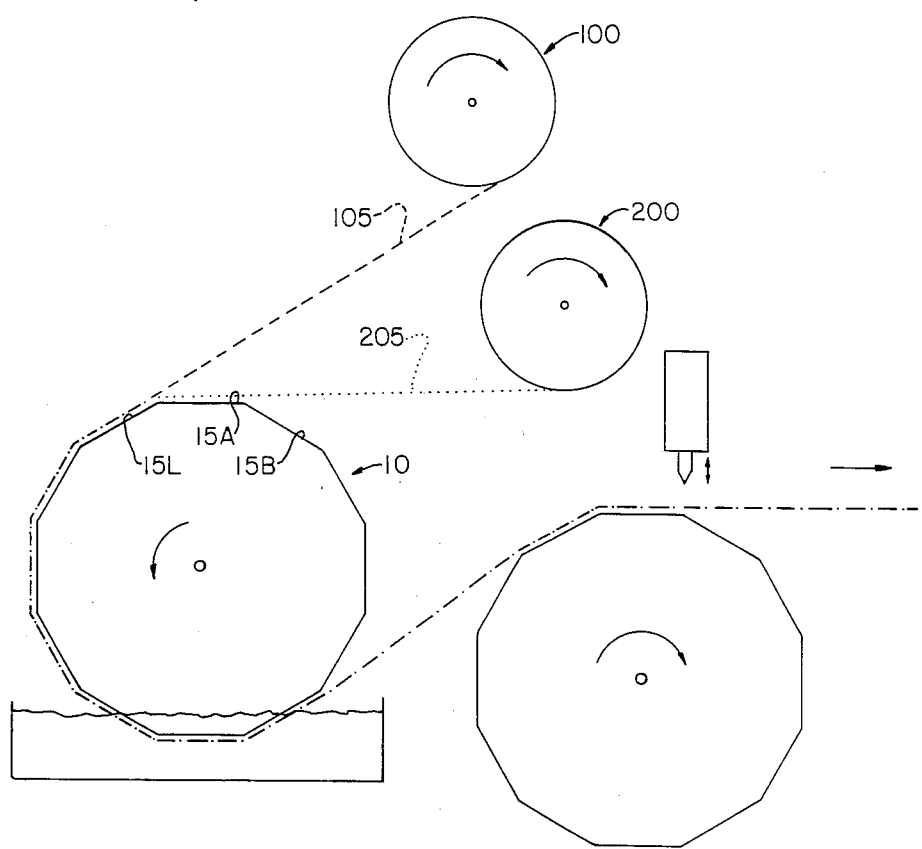
FIGS. 2A–2G are representations of various steps in the new method for electrically interconnecting a plurality of solar cells in series so as to form a solar cell array.

Looking first at FIG. 1, there is shown an apparatus comprising a plurality of means for practicing the present method for electrically interconnecting a plurality of photovoltaic solar cells in series so as to form a series array of cells. The illustrated apparatus comprises a rotatable multi-faced drum 10, a movable first bus spool 100, and a movable second bus spool 200.

Drum 10 is polygonal in nature, comprising a plurality of flat peripheral faces 15. For the sake of example, drum 10 is shown formed with twelve faces 15A-15L. However, it is to be appreciated that a twelve-faced drum is not critical to the present invention and drum 10 could have more or less than twelve faces. The faces 15A-15L are identically sized and shaped so as to be able to accommodate a solar cell 20 thereon.

Drum 10 includes means for releasably securing solar cells 20 to its drum faces 15. Such means are well known to those skilled in the art, and the particular embodiment chosen is not critical to the present invention. By way of example, such means may comprise a plurality of radially-extending blind holes 30A-30L and a plurality of axially-extending bores 35A-35L, with radial bores 30A-30L intersecting drum faces 15A-15L, respectively, and axial bores 35A-35L intersecting radial bores 30A-30L, respectively, at positions interior the drum. Valve means (not shown) are used to selectively apply suction to the various faces 15A-15L via bores 30A-30L and 35A-35L, whereby solar cells will be held against the respective drum faces. Furthermore, by selectively terminating the suction applied to one or more of the axial bores 35A-35L, the solar cells may be removed from the respective drum faces.

Drum 10 is adapted to be rotated about its axis by drum drive means so that the drum may be indexed or stepped forward in rotation one face at a time. Such stepping or indexing drive means are well known to those skilled in the art, and the particular embodiment chosen is not critical to the present invention. By way of example, the drum drive means may comprise a stepping motor 40 and a drive train 45. Drum 10 and its associated drive means are adapted so that at the start and finish of each indexing, one face of the drum will always be located at the drum's top loading position wherein it extends in a horizontal direction (drum face 15A occupies this position in FIG. 1), and one adjacent face will always be located at the drum's post-loading position wherein it extends in a non-horizontal position (drum face 15L occupies this position in FIG. 1). It is to be appreciated that the particular drum face which occupies the drum's post-loading position at any given time will always be the drum face which occupied the drum's loading position prior to the drum's last indexing, and that the particular drum face which occupies the drum's loading position at any given time will always be the drum face which will occupy the drum's post-loading position after the drum's next indexing.

The first and second bus spools 100 and 200 are disposed parallel to one another (FIG. 1A), and include a first bus strip 105 and a second bus strip 205, respectively. Bus strips 105 and 205 are essentially flat strips or ribbons of conductive material which are coiled about their respective spools. To facilitate comprehension, FIGS. 1 and 2A-2G show first bus strip 105 in dashed form and second bus strip 205 in dotted form, and an alternating dashed-dotted line is used in FIGS. 2A-2G to indicate where first bus strip 105 and second bus strip 205 extend parallel to one another.

First bus spool 100 and second bus spool 200 are each adapted to be moved between a first raised position wherein the spool's associated bus strip may be extended flush with the drum face which then occupies the drum's post-loading position, and a second lowered position wherein its associated bus strip may be extended flush with the drum face which then occupies the drum's loading position. More specifically, in FIG. 1 first bus spool 100 is shown in its first raised position, while second bus spool 200 is shown in its second lowered position. When bus spool 100 is in its first raised position, its first bus strip 105 may be extended flush with the drum face which then occupies the drum's post-loading position, e.g. in FIG. 1, first bus strip 105 extends flush to drum face 15L which occupies the drum's post-loading position. When second bus spool 200 is in its second lowered position, its second bus strip 205 may be extended flush with the drum face which then occupies the drum's loading position, e.g. in FIG. 1, second bus strip 205 extends flush with drum face 15A which occupies the drum's loading position. Conversely, when first bus spool 100 is in its second lowered position (FIG. 2D), its first bus strip 105 may be extended flush with the drum face which then occupies the drum's loading position, e.g. if drum 10 were in the position shown in FIG. 1 while first bus spool 100 was in its second lowered position, bus strip 105 could be extended flush with drum face 15A. In the same manner, when second bus spool 200 is in its first raised position (FIG. 2D), its second bus strip 205 may be extended flush with the drum face which then occupies the drum's post-loading position, e.g. if the drum were in the position shown in FIG. 1 while second bus spool 200 was in its first raised position, second bus strip 205 could be extended flush with drum face 15L.

The means for shifting first bus spool 100 and second bus spool 200 between their first raised and second lowered positions is not critical and various means known to those skilled in the art may be used. By way of example, spools 100 and 200 may be mounted on lever assemblies 305 and 310, respectively, that are supported by a frame 312 and are operated by a drive apparatus 315, as shown in FIG. 1.

Drum 10, first bus spool 100 and second bus spool 200 are utilized in the following manner to electrically interconnect a plurality of solar cells in series so as to form a solar cell array. For convenience of description, it will be assumed that drum 10 is initially disposed in the position shown in FIG. 1, i.e., so that its face 15A occupies the drum's loading position and its face 15L occupies the drum's post-loading position, and the first and second bus strips 105 and 205 have been wrapped around drum 10 and are held there by suction applied via the holes in faces 15A-15F. It is to be appreciated that bus strips 105 and 205 are extended around drum 10 so that the two strips are spaced apart from one another along the axis of drum 10, in the manner shown in FIG. 1A.

Step 1: First, first bus spool 100 is placed in its first raised position (if it is not already in that position), so that (a) bus strip 105 extends flush along the drum face which currently occupies the drum's post-loading position (i.e., face 15L), and (b) the strip extends at an inclined angle above the drum face which currently occupies the drum's loading position (i.e., face 15A). In addition, second bus spool 200 is placed in its second lowered position (if it is not already in that position) so that bus strip 205 extends flush along the drum face which currently occupies the drum's loading position (i.e., face 15A). FIG. 2A illustrates the status of the apparatus at the conclusion of Step 1 of the method.

Figures 2B, 2C:
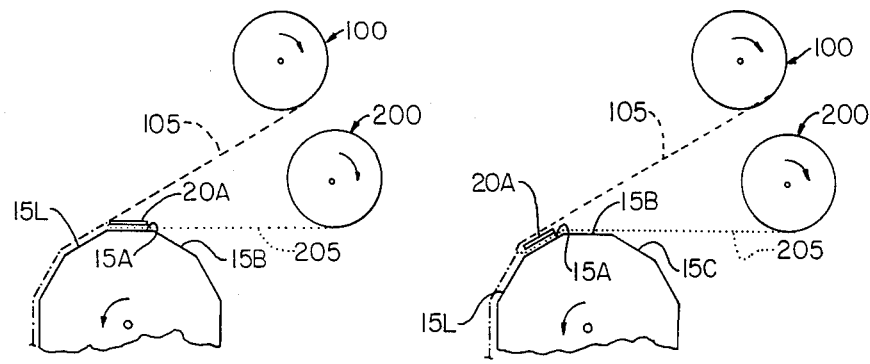

Step 2: Next, a solar cell 20A is positioned on the drum face which currently occupies the drum's loading position (i.e., face 15A) so that the cell sits atop bus strip 205, with the cell's bottom electrode overlying and contacting that bus strip. At this time suction is applied via bore 35A and blind hole 30A so as to hold cell 20A securely against drum face 15A. FIG. 2B illustrates the status of the apparatus at the conclusion of Step 2 of the method.

Step 3: Thereafter, the drum is indexed forward one face by the aforementioned drum drive means, so that the drum face which previously occupied the drum's loading position (i.e., face 15A) is advanced to the drum's post-loading position, and the adjacent drum face (i.e., face 15B) is advanced to the drum's loading position. Since solar cell 20A is securely attached to drum face 15A, it is advanced also by the drum's movement. As the drum is indexed forward in this manner, the first and second bus strips are advanced and, on account of the relative positioning of drum 10 and first bus spool 100, the first bus strip 105 is brought across the top of cell 20A so that the first bus strip overlies and contacts the cell's top grid-like electrode, even as the second bus strip 205 remains in engagement with the cell's bottom electrode. FIG. 2C illustrates the status of the apparatus at the conclusion of Step 3 of the method.

Figures 2D, 2E:
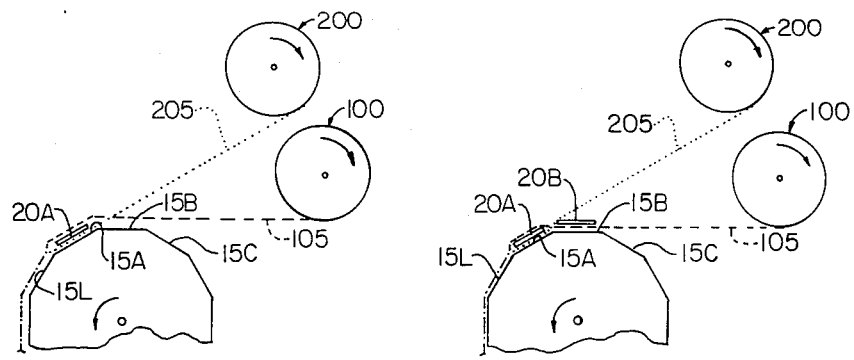

Step 4: Next, first bus spool 105 is transferred from its first raised position to its second lowered position, and second bus spool 205 is transferred from its second lowered position to its first raised position, so that the second bus strip now extends flush along the drum face which is located at the drum's post-loading position (i.e., drum face 15A), and the first bus strip now extends flush with the drum face which is located at the drum's loading position (i.e., drum face 15B). FIG. 2D illustrates the status of the apparatus at the conclusion of Step 4 of the method.

Step 5: Then a new solar cell 20B is positioned on the drum face which currently occupies the drum's loading position (i.e., face 15B) so that the new cell sits atop first bus strip 105, with the cell's bottom electrode overlying and contacting the bus strip. Suction is applied via bore 35B and blind hole 30B so as to hold cell 20B securely against drum face 15B. FIG. 2E illustrates the status of the apparatus at the conclusion of Step 5 of the method.

Figures 2F, 2G:
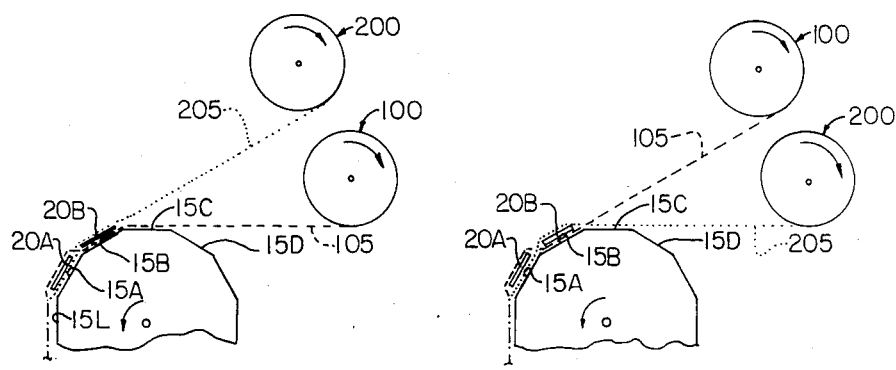

Step 6: Thereafter, the drum is indexed forward one face again, so that the drum face which previously occupied the drum's loading position (i.e., face 15B) is advanced to the drum's post-loading position, and the adjacent drum face (i.e., drum face 15C) is advanced to the drum's loading position. Since they are securely attached to drum faces 15A and 15B, solar cells 20A and 20B are also advanced by the drum's movement (as are the two bus strips). As the drum is indexed forward in this manner, the relative positioning of drum 10 and second bus spool 200 causes second bus strip 205 to be brought across the top of cell 20B so that the second bus strip overlies and contacts the top electrode of that cell, even as the first bus strip remains in engagement with that solar cell's bottom electrode. FIG. 2F illustrates the status of the apparatus at the conclusion of Step 6 of the method.

Step 7: Next, second bus spool 200 is transferred from its first raised position back to its second lowered position, and first bus spool 100 is transferred from its second lowered position back to its first raised position, so that first bus strip 105 extends flush along the drum face which is located at the drum's post-loading position (i.e., face 15B), and second bus strip 205 extends flush along the drum surface which currently occupies the drum's loading position (i.e., face 15C). FIG. 2G illustrates the status of the apparatus at the conclusion of Step 7 of the method.

It is to be appreciated that, at the conclusion of the foregoing Step 7, the solar cells 20A and 20B have been effectively interwoven between the two electrically conducting bus strips 105 and 205, so that bus strip 105 runs between the top electrode of cell 20A and the bottom electrode of cell 20B, and bus strip 205 runs between the bottom electrode of cell 20A and the top electrode of cell 20B. In addition, it is to be appreciated that at the conclusion of Step 7, first spool 100 and second spool 200 have been returned to exactly the state they occupied at the end of Step 1. Accordingly, if it is desired to interweave additional solar cells with bus strips 105 and 205, Steps 2–7 are simply repeated as needed. Of course, it will be appreciated that inasmuch as Steps 2–7 encompass the interweaving of two solar cells with the bus strips, in cases where it is desired to form the array out of an odd number of solar cells, the subsequent repetition of Steps 2–7 may be terminated at Step 3 (or Step 4) rather than at Step 7.

In conjunction with the foregoing, the first and second bus strips must be securely attached to the solar cells' electrodes by soldering, a conductive cement, or similar means. This may be done either before or after the cells leave drum 10. Various techniques known to persons skilled in the art may be used to conductively secure the bus strips to the electrodes of the solar cells carried by drum 10. The particular technique employed for this purpose is not critical to the invention. Preferably, however, the bus strips are soldered to the solar cells and the solder is applied while the cells are still on drum 10. By way of example, drum 10 is positioned so that it is partially immersed in a molten solder bath 400, as shown in FIG. 1. As the drum is indexed forward in the manner previously described, each of the drum's faces (and hence any cells seated on those faces) will pass through the bath. When each silicon solar cell is immersed in the solder bath, only its metal surfaces will be wetted by the molten solder. As each solar cell moves out of bath 400 into the cooler atmosphere, the solder adhering to the cell's electrodes will cool and solidify, thereby causing each cell to be bonded to bus strips 105 and 205. It is to be noted that bus strips 105 and 205 are made of a metal which has a melting point higher than the temperature of the solder bath to keep the bus strips from melting as they are immersed in the bath. By way of example, bus strips 105 and 205 may be made of copper, and the solder of bath 400 may be made of lead and tin. Alternatively, the bus strips could be securely attached to the cells after the cells leave drum 10. For example, such attachment could be effected by passing the cells and strips 105 and 205 through a wave soldering device, in ways well known in the art.

After the bus strips have been securely attached to the cell electrodes, the interconnected solar cells will be in the form shown in FIG. 3. Specifically, each intermediate cell in the array (i.e., each cell in the array disposed intermediate the two end cells of the array) will be connected to its two neighboring cells by the two bus strips, with the top electrode of a particular cell connected to the two bottom electrodes of the two immediately adjacent cells by one bus strip, and the bottom electrode of that particular cell connected to the two top electrodes of the two immediately adjacent cells by the other bus strip. However, that is not the exact electrical interconnection required to form a series array of solar cells. Instead, for a series array of solar cells, the top electrode of a given intermediate cell must be connected to the bottom electrode of only one immediately adjacent cell, and the bottom electrode of that given cell must be connected to the top electrode of only the other immediately adjacent cell. Hence, in order to form a series array of solar cells, the two bus strips must still be alternately severed between adjacent cells (and also at the start and end of the array), so as to achieve an array as shown in FIG. 4.

The bus strips may be alternately severed between adjacent cells either before the cells leave drum 10 or after the cells leave drum 10. Various means well known to persons skilled in the art may be used for appropriately severing the bus strips, since the use of a particular severing means is not critical to the present invention.

Referring again to FIG. 1, it is preferred to sever the strips after the cells leave drum 10 by passing the cells over a cutting drum 500 after they leave the soldering device. It is to be noted that transfer of a solar cell from drum 10 to cutting drum 500 involves terminating the suction holding the solar cell to drum 10, so as to release it for movement toward drum 500.

Cutting drum 500 preferably is similar to drum 10, having a series of flat faces 515A-515L which are sized so that each will accommodate one solar cell thereon. Although not shown, it is to be understood that drum 500 may have suction holes in its flat faces for causing the interwoven solar cells to be held to the cutting drum as it rotates. Cutting drum 500 is driven by a drive means comprising a stepping motor 50 and a drive train 55 so as to be indexed forward one face at a time in synchronism with drum 10, so that when face 15A is occupying the top position of drum 10, a face 515A will be occupying the top position of drum 500. As the solar cells leave the solder bath 400, they are transported directly onto faces 515A-515L of drum 500 and held there by suction. A cutter device 600 is disposed adjacent cutting drum 500 and is adapted to be operated once immediately after drums 10 and 500 are indexed forward one face position. Cutter 600 is arranged so as to alternately sever bus strips 105 and 205 intermediate the cells, so as to achieve a series array as shown in FIG. 4. As each solar cell passes the cutter 600, the suction holding it to drum 500 is terminated so as to allow that solar cell to move away from the drum.

It should be appreciated, further, that it is possible to modify the foregoing manner of practicing the invention without departing from the scope of the present invention. Thus, for example, Steps 3 and 4 might be consolidated into a single step, and/or Steps 6 and 7 might be consolidated into a single step. It is also anticipated that the act of securely attaching the bus strips to the cell electrodes, and/or the act of alternately severing the two bus strips between adjacent cells, could be incorporated into the foregoing Steps 2-7. It is also to be appreciated that although the drum's loading position is shown in the preferred embodiment to be at the drum's top horizontal position (i.e., at the position occupied by face 15A in FIG. 1), and its post-loading position is shown to be at the drum's adjacent non-horizontal position, the drum's loading position and post-loading position could be located at different drum positions. Furthermore, although in the preferred embodiment the bus spools' first position is shown to be raised relative to drum 10 and their second position lowered relative to drum 10, it is contemplated that depending on the disposition of the drum's loading position and post-loading position, the bus spools' first and second positions might bear a different positional relationship to the drum. For example, if the drum's loading position were positioned at the drum's bottom horizontal position (i.e., at the 6 o'clock position occupied by face 15G in FIG. 1), the bus spools' first position would be lowered relative to drum 10 whereas their second position would be raised relative to the drum, i.e., precisely the geometric reverse of what they are in the preferred embodiment. Still other modifications of this sort will be obvious to persons skilled in the art.

Advantages of the Invention

There are numerous advantages to using the present invention.

First, the present invention provides a new and useful method for electrically interconnecting a plurality of solar cells in series so as to produce a series array of solar cells.

Second, the present invention provides a novel method for electrically interconnecting a plurality of solar cells in series which is fast and simple and which lends itself well to automated assembly techniques.

Still other advantages of the invention will be obvious to persons skilled in the art.

What I claim is:

1. A method for electrically interconnecting a plurality of photovoltaic solar cells in series, said solar cells each having a top surface characterized by a top grid electrode and a bottom surface characterized by a bottom electrode;

said method involving the use of a rotatable multi-faced drum, and first and second movable bus supply spools supporting first and second continuous electrically conductive bus strips, respectively;

said drum being adapted for (1) releasably holding a solar cell on each of its faces, and (2) rotation on its axis in an indexing mode so that it advances intermittently in a selected direction one face at a time, whereby at the conclusion of each indexing motion one face of said drum is always disposed in a predetermined loading position in which it extends in a first selected plane and an adjacent face of said drum is always disposed in a predetermined post-loading position in which it extends in a second selected plane disposed at an angle to said first selected plane, said first and second bus supply spools each being adapted to be moved between a first position wherein the associated bus strip extends substantially flush with the drum face which currently occupies said drum's post-loading position, and a second position wherein the associated bus strip extends substantially flush with the drum face which currently occupies said drum's loading position;

said method comprising the steps of:
(1) positioning said first bus supply spool in its said first position with said first bus strip extending around said drum and substantially flush with the drum face occupying said post-loading position, and positioning said second bus spool in its said second position with said second bus strip extending around said drum and substantially flush with the drum face occupying said loading position;
(2) positioning a first solar cell on the drum face occupying said loading position so that said first solar cell extends over and engages said second bus strip, with the bottom electrode of said first solar cell overlying and contacting said second bus strip;
(3) indexing said drum forward one face so that said drum face carrying said first solar cell is advanced to said post-loading position, whereby said first bus strip is caused to extend across and overlie the top grid electrode of said first solar cell while said second bus strip remains in contact with the bottom electrode of said first solar cell;
(4) shifting said first bus spool from its first position to its second position and shifting said second bus spool from its second position to its first position, so that said second bus strip extends flush with the drum face which is in said post-loading position and said first bus strip extends flush with the drum face which is in said loading position;
(5) positioning a second solar cell on the drum face which is in said loading position so that the bottom electrode of said second solar cell overlies and engages said first bus strip;
(6) indexing said drum forward one face so that the drum face carrying said second solar cell is advanced to said post-loading position, whereby said second bus strip is caused to overlie and engage the top grid electrode of said second solar cell even as said first bus strip remains in contact with the bottom electrode of said second solar cell;
(7) shifting said first bus spool from its second position back to its first position, and shifting said second bus spool from its first position back to its second position, so that said first bus strip extends flush to the drum face which currently occupies said post-loading position, and said second bus strip extends flush to the drum face which currently occupies said loading position; and
(8) thereafter securely attaching said first and second bus strips to the adjacent engaged electrodes of said first and second solar cells.

2. A method according to claim 1 wherein said first and second bus strips are securely attached to the electrodes of said first and second solar cells by soldering.

3. A method according to claim 2 further including the step of selectively severing said first and second bus strips so as to provide a predetermined electrical connection arrangement between said first and second solar cells.

4. A method according to claim 3 wherein said bus strips are severed after removal of said first and second solar cells from said drum.

5. A method according to claim 4 wherein said bus strips are alternately severed between adjacent solar cells.

6. A method according to claim 3 wherein said bus strips are severed while said solar cells are carried by said drum.

7. A method according to claim 3 wherein said bus strips are severed after separation of said solar cells from said drum.

8. A method for electrically interconnecting in series a plurality of photovoltaic solar cells each having a top grid electrode and a bottom electrode, said method comprising the steps of:
(1) positioning a first bus spool containing a first bus strip in a first position relative to a multi-faced drum and extending said first bus strip around said drum so that said first bus strip extends flush with a face which currently occupies a drum post-loading position;
(2) positioning a second bus spool containing a second bus strip in a second position relative to said drum and extending said second bus strip around said drum so that said second bus strip extends flush with a drum face which currently occupies a drum loading position removed from but adjacent to said drum post-loading position;
(3) positioning a first solar cell on the drum face located at said drum loading position so that the bottom electrode of said cell overlies and engages said second bus strip;
(4) indexing said drum forward in rotation one face so that the drum face carrying said first solar cell is advanced to said drum post-loading position, whereby said first bus strip will overlie and contact the top grid electrode of said first cell even as said second bus strip remains in contact with the bottom electrode of said first cell;
(5) transferring said first bus spool from its said first position to a second position, and transferring said second bus spool from its said second position to a first position, so that said second bus strip will extend flush with the drum face which currently occupies said drum post-loading position, and said first bus strip will extend flush with the drum face which currently occupies said drum loading position;
(6) positioning a second solar cell on the drum face which currently occupies said drum loading position so that the bottom electrode of said second solar cell overlies and contacts said first bus strip;
(7) indexing said drum forward in rotation one face so that the drum face carrying said second solar cell is advanced to said drum post-loading position, whereby said second bus strip will overlie and contact the top grid electrode of said second cell even as said first bus strip remains in contact with the bottom electrode of said second cell;
(8) shifting said first bus spool from its second position back to its first position, and shifting said second bus spool from its first position back to its second position, so that said first bus strip extends flush to the drum face which currently occupies said drum post-loading position and said second bus strip extends flush to the drum face which currently occupies said drum's loading position; and
(9) repeating the foregoing steps as necessary so as to electrically interconnect additional solar cells into a selected solar cell array.

9. A method according to claim 8 further including the steps of conductively securing said first and second bus strips to the electrodes of said solar cells.

10. A method according to claim 9 wherein said bus strips are secured to the electrodes of said cells by soldering.

11. A method according to claim 9 wherein said bus strips are secured to said electrodes by (1) passing said solar cells and said bus strips through a molten solder bath whereby molten solder will wet said strips and said electrodes, and (2) removing said solar cells from said solder bath and subjecting said cells to cooling so as to cause the molten solder on said strips and electrodes to solidify.

12. A method for electrically interconnecting in series a plurality of photovoltaic solar cells each having a top electrode and a bottom electrode, said method involving the use of first and second mutually spaced, parallel, continuous electrically conductive bus strips, wherein each of said bus strips is electrically conductive along its entire length, said method comprising the steps of:
(a) weaving said first and second parallel, mutually spaced bus strips over and under the top and bottom electrodes respectively of a plurality of said solar cells as said solar cells are advanced in series along a predetermined path, so that each solar cell has its top electrode engaged by one of said bus strips and its bottom electrode engaged by the other of said bus strips; and
(b) alternately severing said first and second bus strips between adjacent solar cells so as to create a first section of said first bus strip extending from the bottom electrode of one solar cell to the top electrode of a first adjacent solar cell and a first section of said second bus strip extending from the top electrode of said one solar cell to the bottom electrode of a second adjacent solar cell.

13. A method according to claim 12 further including the steps of soldering said first section of said first strip to the bottom electrode of said one solar cell and the top electrode of said first adjacent solar cell, and soldering the first section of said second strip to the top electrode of said one solar cell and the bottom electrode of said second adjacent solar cell.

14. A method according to claim 13 wherein said first section of said first strip is soldered to the bottom electrode of said one solar cell (a) after the first section of said first strip is soldered to the top electrode of said first adjacent solar cell and (b) before said first section of said second strip is soldered to the top electrode of said one solar cell.

15. A method for electrically interconnecting in series a plurality of photovoltaic solar cells each having a top electrode and a bottom electrode, said method involving the use of first and second mutually spaced continuous electrically conductive bus strips, said method comprising the steps of:
(a) simultaneously weaving said first and second bus strips over and under the top and bottom electrodes respectively of a plurality of said solar cells as said solar cells are advanced in series along a predetermined path, so that each solar cell has its top electrode engaged by one of said bus strips and its bottom electrode engaged by the other of said bus strips; and
(b) alternately severing said first and second bus strips between adjacent solar cells so as to create a first section of said first bus strip extending from the bottom electrode of one solar cell to the top electrode of a first adjacent solar cell and a first section of said second bus strip extending from the top electrode of said one solar cell to the bottom electrode of a second adjacent solar cell.

16. A method for electrically interconnecting in series a plurality of photovoltaic solar cells each having a top electrode and a bottom electrode, said method involving the use of first and second mutually spaced continuous electrically conductive bus strips, said method comprising the steps of:
(a) continuously weaving said first and second bus strips over and under the top and bottom electrodes respectively of a plurality of said solar cells as said solar cells are advanced in series along a predetermined path, so that each solar cell has its top electrode engaged by one of said bus strips and its bottom electrode engaged by the other of said bus strips; and
(b) alternately severing said first and second bus strips between adjacent solar cells so as to create a first section of said first bus strip extending from the bottom electrode of one solar cell to the top electrode of a first adjacent solar cell and a first section of said second bus strip extending from the top electrode of said one solar cell to the bottom electrode of a second adjacent solar cell.

* * * * *